(12) United States Patent
Malik et al.

(10) Patent No.: US 11,634,529 B2
(45) Date of Patent: Apr. 25, 2023

(54) MULTILAYER STRUCTURE

(71) Applicant: Fujifilm Electronic Materials U.S.A., Inc., N. Kingstown, RI (US)

(72) Inventors: Sanjay Malik, Attleboro, MA (US); William A. Reinerth, Riverside, RI (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 279 days.

(21) Appl. No.: 16/009,256

(22) Filed: Jun. 15, 2018

(65) Prior Publication Data

US 2018/0366419 A1 Dec. 20, 2018

Related U.S. Application Data

(60) Provisional application No. 62/520,850, filed on Jun. 16, 2017.

(51) Int. Cl.
*C08F 283/04* (2006.01)
*H01L 23/498* (2006.01)
(Continued)

(52) U.S. Cl.
CPC ........ *C08F 283/04* (2013.01); *C08G 73/0672* (2013.01); *C09D 4/06* (2013.01);
(Continued)

(58) Field of Classification Search
CPC ............. H01L 23/562; H01L 23/49894; H01L 23/5385; H01L 23/5386; H01L 23/5389; H01L 21/481; H01L 23/145; H01L 23/3142; H01L 23/5383; C08G 73/0672; C09D 179/08; C09D 4/06; C09J 4/00; C08F 283/04; C08F 283/0672; C08F 130/08;
(Continued)

(56) References Cited

U.S. PATENT DOCUMENTS 4,643,910 A * 2/1987 Foutz ...................... H01B 3/306
427/10
4,988,413 A * 1/1991 Chakravorty ............ C25D 5/02
205/118

(Continued)

FOREIGN PATENT DOCUMENTS

| JP | H 7-094540 A | 4/1995 | ............. H01L 21/56 |
| JP | H 7-286041 A | 10/1995 | ............. C08G 73/10 |

(Continued)

OTHER PUBLICATIONS

The International Search Report and Written Opinion of the International Searching Authority for International Application No. PCT/US2018/037712 dated Sep. 25, 2018.

(Continued)

*Primary Examiner* — Dale E Page
*Assistant Examiner* — Quovaunda Jefferson
(74) *Attorney, Agent, or Firm* — Fish & Richardson P.C.

(57) ABSTRACT

This disclosure relates to a multilayer structure containing: a substrate; a coupling layer deposited on the substrate; and a dielectric layer deposited on the coupling layer, wherein shear strength is increased by a factor of at least about 2 in the presence of the coupling layer compared to a multilayer in the absence of the coupling layer.

16 Claims, 1 Drawing Sheet

| Dielectric Layer |
| Coupling Layer |
| Substrate |

(51) Int. Cl.
| | |
|---|---|
| *H01L 21/48* | (2006.01) |
| *C08G 73/06* | (2006.01) |
| *C09D 179/08* | (2006.01) |
| *H01L 23/538* | (2006.01) |
| *H01L 23/00* | (2006.01) |
| *H01L 23/14* | (2006.01) |
| *C09J 4/00* | (2006.01) |
| *C09D 4/06* | (2006.01) |
| *H01L 23/31* | (2006.01) |

(52) U.S. Cl.
CPC .............. *C09D 179/08* (2013.01); *C09J 4/00* (2013.01); *H01L 21/481* (2013.01); *H01L 23/145* (2013.01); *H01L 23/3142* (2013.01); *H01L 23/49894* (2013.01); *H01L 23/5383* (2013.01); *H01L 23/5386* (2013.01); *H01L 23/5389* (2013.01); *H01L 23/562* (2013.01)

(58) Field of Classification Search
CPC .............. C08F 222/102; C08F 222/103; C08J 2333/08; C08J 2333/10; C08J 2363/02; C08J 2379/08; C08J 7/042
See application file for complete search history.

(56) References Cited

U.S. PATENT DOCUMENTS

| | | | | |
|---|---|---|---|---|
| 5,366,906 | A * | 11/1994 | Wojnarowski | H01L 23/5389 438/17 |
| 5,543,493 | A | 8/1996 | Park et al. | |
| 6,693,049 | B2 * | 2/2004 | Iguchi | G03F 7/70341 257/E21.579 |
| 2006/0043532 | A1 | 3/2006 | Senoo et al. | |
| 2007/0013049 | A1 * | 1/2007 | Asai | H01L 23/145 257/700 |
| 2007/0017631 | A1 | 1/2007 | Xu | |
| 2007/0212494 | A1 * | 9/2007 | Xu | G11B 5/855 427/401 |
| 2008/0099903 | A1 * | 5/2008 | Shen | H01L 24/24 257/686 |
| 2010/0035052 | A1 | 2/2010 | Farah | |
| 2010/0118244 | A1 * | 5/2010 | Lee | G02F 1/13394 349/122 |
| 2015/0118448 | A1 | 4/2015 | Bai et al. | |
| 2016/0313641 | A1 | 10/2016 | De et al. | |
| 2016/0313642 | A1 * | 10/2016 | Malik | G03F 7/0387 |
| 2017/0081567 | A1 * | 3/2017 | Ha | C08F 220/1808 |
| 2017/0373041 | A1 | 12/2017 | Kim et al. | |

FOREIGN PATENT DOCUMENTS

| | | | | |
|---|---|---|---|---|
| JP | 2000-131845 A | 5/2000 | ............. | G03F 7/039 |
| JP | 2009-503139 A | 1/2009 | ............... | C09J 5/06 |
| JP | 2013-258332 A | 12/2013 | ............. | H01L 21/02 |
| JP | 2015-122483 A | 7/2015 | ............. | H01L 21/02 |
| JP | 2016-063009 A | 4/2016 | ........... | H01L 21/312 |
| TW | 200524492 | 7/2005 | ............... | H05K 3/00 |
| TW | 200804527 | 1/2008 | ................ | C08L 9/00 |
| TW | 201702318 | 1/2017 | ............ | C08L 101/12 |
| WO | WO 2005/032227 | 4/2005 | ............... | H05K 3/46 |
| WO | WO 2017/116858 | 7/2017 | ............. | H01L 21/02 |
| WO | WO 2018/004050 | 1/2018 | ........... | H01L 21/683 |

OTHER PUBLICATIONS

The International Preliminary Report on Patentability for International Application No. PCT/US2018/037712 dated Dec. 26, 2019.
The Supplementary European Search Report for European Application No. EP 18 81 6870 dated Apr. 29, 2020.
Office Action and Search Report issued by the Taiwan Patent Office for Application No. 107120842 dated Jan. 5, 2022 and the English summary of the Office Action.
Notice of Reasons for Refusal issued by the Japanese Patent Office for Application No. JP 2019-569720, dated May 31, 2022.
Notice of Preliminary Rejection issued by the Korean Intellectual Property Office for Application No. KR 10-2019-7032823, dated Sep. 21, 2022 (with English Translation).
Office Action in Japanese Appln. No. 2019-569720, dated Oct. 11, 2022, 5 pages (with English translation).
Office Action in Chinese Appln. No. 201880038543.9, dated Jan. 18, 2023, 15 pages (with English translation).

* cited by examiner

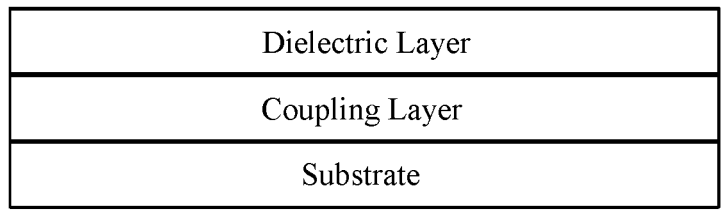

MULTILAYER STRUCTURE

CROSS-REFERENCE TO RELATED APPLICATION

The present application claims priority to U.S. Provisional Application Ser. No. 62/520,850, filed on Jun. 16, 2017, the contents of which are hereby incorporated by reference in their entirety.

BACKGROUND OF THE DISCLOSURE

The continued expansion of mobile computing applications requires the packing of ever growing levels of computing power in smaller device footprints. Designers of semiconductor devices are relying on the use of a variety of new chip architectures to meet the new device requirements. These new architectures include flip chip wafer bumping using copper pillars as well as approaches employing through silicon vias (TSV) such as three-dimensional integrated circuits (3D IC) in which wafers are thinned, the resulting dies are stacked and then connected by TSV and 2.5D interposer designs. These approaches pose significant challenges not only for the designers of these new IC architectures, but for the designers of the packaging materials that will be used for these devices.

Dielectric material requirements for packaging applications are continuously evolving as these new, advanced devices are relying heavily on wafer and panel-level packaging (WLP and PLP) and 3D integration. While there are a number of traditional dielectric materials that have been employed through the years, polyimides, due to their excellent electrical, mechanical and thermal properties, have been the material of choice for semiconductor packaging applications. Drawbacks of conventional polyimides include high cure temperatures (>350° C.), high post-cure shrinkage and high levels of moisture absorption. The high cure temperature requirement for PI poses limitation on its usage for panel-level manufacturing as the plastic core employed in panel manufacturing cannot withstand temperatures higher than about 250° C. The high shrinkage of conventional polyimides leads to cured films having high residual stress which leads to bowing of the silicon wafer and warpage of the plastic core. Next generation chip architectures employing 3D integration require that the silicon wafers be thinned down (as thin as 20 μm in the most advanced applications) in order to satisfy requirements for vertical integration. These thinned wafers are extremely fragile and excessive residual stress in the packaging material used could be catastrophic. Next generation dielectric materials must be designed so as to impart minimal stress on the wafer or panel. For this reason, low cure temperature and low post-cure shrinkage are critical requirements for advanced packaging materials. The demanding performance requirements being required of next generation dielectric materials (low cure temperature, low shrinkage, high thermal stability, low moisture uptake, low residual stress, superior adhesion, copper compatibility, high resolution, etc.) makes it increasingly difficult for a single material to satisfy all of these (sometimes conflicting) demands. One approach to address the requirements of superior adhesion and compatibility with substrates such as epoxy molded compounds (EMC) is to apply a thin adhesive primer layer prior to application of the dielectric film. In this approach the coupling layer provides high adhesive strength between the substrate and the photoimageable dielectric while the dielectric film provides high resolution as well as the necessary mechanical and electrical properties.

SUMMARY OF THE DISCLOSURE

In some embodiments, this disclosure features a multilayer structure comprising (e.g., from bottom to top): a substrate; a coupling layer on (e.g., deposited on or supported by) the substrate; and a dielectric layer on (e.g., deposited on or supported by) the coupling layer, wherein shear strength of the dielectric layer is increased by a factor of at least about 2 (e.g., by a factor of at least about 3) in the presence of the coupling layer compared to a multilayer structure without the coupling layer.

In some embodiments, the coupling layer is prepared from a composition comprising at least one polymer, at least one cross-linker, at least one initiator capable of inducing a cross-linking reaction, and at least one solvent.

In some embodiments, the dielectric layer contains at least one polymer selected from the group consisting of polyimides, polybenzoxazoles, (meth)acrylate polymers, epoxy polymers, polyurethanes, polyamides, polyesters, polyethers, novolac resins, benzocyclobutene resins, polystyrenes, and a mixture thereof. In some embodiments, the dielectric layer can include a polyimide and/or a (meth)acrylate polymer.

Some embodiments of this disclosure include a process for preparing a multilayer structure described herein. The process can include: (a) coating a substrate with a composition that forms the coupling layer to form a first coated substrate; and (b) coating the first coated substrate with a composition that forms the dielectric layer.

In some embodiments, the coupling layer is cross-linked by subjecting the first coated substrate to a step of baking or exposing to a source of light.

In some embodiments, the dielectric layer is cross-linked by subjecting the dielectric layer to a step of baking or exposing to a source of light.

General Definition

As used herein, a "dielectric layer" refers to a layer having a dielectric constant of from 2 to 5 when measured at frequencies from 1 kHz to 100 GHz. As used herein, the term "fully imidized" means the polyimide polymers of this disclosure are at least about 90% (e.g., at least about 95%, at least about 98%, at least about 99%, or about 100%) imidized.

BRIEF DESCRIPTION OF DRAWING

FIG. 1 illustrates an exemplary multilayer structure described in this disclosure.

In some embodiments, this disclosure features a multilayer structure containing (e.g., from bottom to top): a substrate; a coupling layer deposited on the substrate; and a dielectric layer deposited on the coupling layer, wherein the shear strength of the dielectric layer is increased by a factor of at least about 2 (e.g., at least about 3 or at least about 5) and/or at most about 10 (e.g., at most about 8 or at most about 6) in the presence of the coupling layer compared to a multilayer structure without the coupling layer As used herein, the shear strength of the dielectric layer refers to the shear strength between the substrate and the dielectric layer (when the coupling layer is absent) or the shear strength between the substrate and the dielectric and coupling layers as a whole (when the coupling layer is present).

In some embodiments, the coupling layer is capable of forming a bond with the strength of at least about 3 Kcal/mole with the substrate and/or the dielectric layer. For example, the bond can have a strength of at least about 3 Kcal/mole (e.g., at least about 6 Kcal/mole, at least about 50 Kcal/mole, or at least about 85 Kcal/mole) and/or at most about 600 Kcal/mole. In some embodiments, the bond can have a strength of from about 2 to about 4 Kcal/mole (Van der Waals force), from about 5 to about 10 Kcal/mole (hydrogen bonding), from about 10 to about 50 Kcal/mole (dipole attraction between molecules), from about 50 to about 120 Kcal/mole (single covalent bonding), or from about 120 to about 950 Kcal/mole (ionic bonding).

In some embodiments, the substrate includes an epoxy molded compound (EMC). In some embodiments, the substrate (e.g., the EMC substrate) contains active and/or passive embedded semiconductor devices, such as functional silicon chips with different dimensions which are produced by different design rules, MEMS, discrete passives, and electro optical devices, etc. In some embodiments, the multilayer structure further comprises at least one patterned metallic structure (e.g., a redistribution layer (RDL)) at a surface of the substrate. In some embodiments, the patterned metallic structure can include copper. In some embodiments, at least a portion of the coupling layer can be deposited on at least a portion of the patterned metallic structure of the substrate. These metallic structures can be useful in producing integrated circuits.

In some embodiments, the coupling layer is prepared from a composition containing at least one polymer, at least one cross-linker, at least one initiator capable of inducing a cross-linking reaction and at least one solvent.

In some embodiments, the at least one polymer that can be used to prepare the coupling layer can include at least one (meth)acrylate polymer. As used herein, the term "(meth) acrylate polymer" includes both methacrylate polymers and acrylate polymers, and includes both homopolymers and copolymers. Examples of suitable (meth)acrylate polymers include, but are not limited to, poly(N,N-dimethylamino ethyl acrylate), poly(benzyl methacrylate), poly(butyl methacrylate), poly(tert-butyl methacrylate), poly(butyl methacrylate-co-isobutyl methacrylate), poly(butyl methacrylate-co-methyl methacrylate), poly(cyclohexyl methacrylate), poly(2-ethylhexyl methacrylate), poly(ethyl methacrylate), poly(hexadecyl methacrylate), poly(hexyl methacrylate), poly(isobutyl methacrylate), poly(isopropyl methacrylate), poly(lauryl methacrylate-co-ethylene glycol dimethacrylate), poly(methyl methacrylate), poly(methyl methacrylate-co-ethyl acrylate), poly(methyl methacrylate-co-ethylene glycol dimethacrylate), poly(octadecyl methacrylate), poly(tetrahydrofurfuryl methacrylate), poly(tetrahydrofurfuryl methacrylate-co-ethyl methacrylate), poly (butyl acrylate), poly(ethyl acrylate), poly(2-ethylhexyl acrylate), and poly(methyl acrylate).

In some embodiments, the amount of the polymer is at least about 35 weight % (e.g., at least about 40 weight %, at least about 45 weight %, at least about 50 weight %, at least about 55 weight %, or at least about 60 weight %) and/or at most about 90 weight % (e.g., at most about 85 weight %, at most about 80 weight %, at most about 75 weight %, at most about 70 weight %, or at most about 65 weight %) of the entire weight of the coupling layer of the multilayer structure.

In some embodiments, the cross-linker includes at least one functional group selected from the group consisting of a vinyl group, an allyl group, a vinyl ether group, a propenyl ether group, a (meth)acryloyl group, a SiH group, and a thiol group.

In some embodiments, the cross-linker is selected from the group consisting of 1,6-hexanediol di(meth)acrylate, tetraethyleneglycol di(meth)acrylate, 1,12-dodecanediol di(meth)acrylate, 1,3-butylene glycol di(meth)acrylate, 1,4-butanediol di(meth)acrylate, cyclohexane dimethanol di(meth)acrylate, polyethylene glycol di(meth)acrylate, propoxylated (3) glycerol tri(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

In one embodiment, a suitable example of a cross-linker includes, but is not limited to, a urethane acrylate oligomer. The term urethane acrylate oligomer refers to a class of compounds that contain urethane linkages and have (meth) acrylate (e.g., acrylate or methacrylate) functional groups such as urethane multi(meth)acrylate, multiurethane (meth) acrylate, and multiurethane multi(meth)acrylate. Types of urethane (meth)acrylate oligomers have been described by, for example, Coady et al., U.S. Pat. No. 4,608,409 and by Chisholm et al., U.S. Pat. No. 6,844,950, the contents of which are hereby incorporated by reference.

Examples of cross-linkers containing thiol groups include, but are not limited to, trimethylolpropane tris(mercaptoacetate), pentaerythritol tetrakis(2-mercaptoacetate), dipentaerythritol hexakis(3-mercaptopropionate), and ethoxylated trimethylolpropane tris-3-mercaptopropionate. Examples of cross-linkers containing vinyl ether groups include, but are not limited to, 1,4-butanediol divinyl ether, 1,6-hexanediol divinyl ether, 1,4-cyclohexanedimethanol divinyl ether, di(ethylene glycol) vinyl ether, poly(ethylene glycol) divinyl ether, and bis[4-(vinyloxy)butyl] (4-methyl-1,3-phenylene)biscarbamate. One example of a cross-linker containing a SiH group is octasilane POSS® SH1310 available from Hybrid Plastics.

In some embodiments, the amount of cross-linker is at least about 5 weight % (e.g., at least about 10 weight %, at least about 15 weight %, at least about 20 weight %, or at least about 25 weight %) and/or at most about 50 weight % (e.g., at most about 45 weight %, at most about 40 weight %, at most about 35 weight %, or at most about 30 weight %) of the entire weight of the coupling layer of the multilayer structure.

Specific examples of initiators capable of inducing a cross-linking reaction (e.g., by generating free radicals when exposed to high energy radiation (also known as photoinitiators)) include, but are not limited to, NCI-831 (Available from ADEKA Corp.), 1,8-octanedione, 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651 from BASF), bis (2,4,6-trimethyl benzoyl)phenyl phosphine oxide (Irgacure 819 from BASF), 2-methyl-1-[4-(methylthio)phenyl]-2-morphorinopropane-1-on (Irgacure 907 from BASF), (2,4,6-trimethylbenzoyl)diphenyl phosphine oxide (Lucerin TPO from BASF), ethoxy(2,4,6-trimethylbenzoyl)phenyl phosphine oxide (Lucerin TPO-L from BASF), 2-(benzoyloxyimino)-1-[4-(phenylthio)phenyl]-1-octanone (OXE-01, available from BASF), 1-(O-acetyloxime)-1-[9-ethyl-6-(2-methylbenzoyl)-9H-carbazol-3-yl]ethanone (OXE-02, available from BASF), a blend of phosphine oxide, hydroxy ketone and a benzophenone derivative (ESACURE KTO46 from Sartomer), 2-hydroxy-2-methyl-1-phenylpropane-1-on (Darocur 1173 from Merck), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoinitiators include (5-toluylsulfonyloxyimino-5H-thiophen-2-ylidene)-2-methylphenyl-acetonitrile(Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl)diazomethane, 1-p-toluenesulfonyl-1-cyclohexylcarbonyldiazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

In embodiments where the crosslinking reaction is initiated by heat, the catalyst used is a thermal initiator, where thermal initiator is a compound capable of generating free radicals when exposed to a temperature from about 70° C. to about 250° C.

Specific examples of thermal initiators include, but are not limited to, benzoyl peroxide, cyclohexanone peroxide, lauroyl peroxide, tert-amyl peroxybenzoate, tert-butyl hydroperoxide, dicumyl peroxide, cumene hydroperoxide, succinic acid peroxide, di(n-propyl)peroxydicarbonate, 2,2-azobis(isobutyronitrile), 2,2-azobis(2,4-dimethylvaleronitrile), dimethyl-2,2-azobisisobutyrate, 4,4-azobis(4-cyanopentanoic acid), azobiscyclohexanecarbonitrile, 2,2-azobis(2-methylbutyronitrile) and the like.

In some embodiments, a combination of two or more initiators can be used in the composition that forms the coupling layer. The combination can be all thermal initiators, all photoinitiators, or a combination of thermal initiators and photoinitiators.

In some embodiments, the amount of the initiator is at least about 0.1 weight % (e.g., at least about 0.5 weight %, at least about 1.0 weight %, at least about 2.0 weight %, at least about 3.0 weight %, or at least about 4.0 weight %) and/or at most about 10.0 weight % (e.g., at most about 9.0 weight %, at most about 08.0 weight %, at most about 7.0 weight %, at most about 6.0 weight %, or at most about 0.50 weight %) of the entire weight of the coupling layer of the multilayer structure.

In general, suitable solvents useful in the compositions used to form the coupling layer should be able to dissolve or disperse all the components of composition to form a homogeneous mixture. Selection of suitable solvent can also be based on the ability of the homogeneous solution thus form to be deposited by any of known methods and to produce a homogeneous film. The selection of suitable solvent can also depend on the ability of the solvent to boil off from the film in the operating temperature range (e.g., from 70° C. to 200° C.) such that the amount of residual solvent in the film is less than about 10% (e.g., less than about 9%, less than about 8%, less than about 7%, less than about 6%, less than about 5%, less than about 4%, less than about 3%, less than about 2%, or less than about 1%) of the total weight of the film. Non-limiting examples of solvents includes tetrahydrofuran (THF), tetrahydrofurfuryl alcohol (THFA), propylene glycol methyl ether acetate (PGMEA), propylene glycol methyl ether (PGME), methyl ethyl ketone (MEK), methyl isobutyl ketone (MIBK) and cyclopentanone (CP).

In some embodiments, the dielectric layer can include at least one binder (e.g., a polymer). In some embodiments, the binder in the dielectric layer is selected from the group consisting of polyimides, polybenzoxazoles, (meth)acrylate polymers, epoxy polymers, polyurethanes, polyamides, polyesters, polyethers, novolac resins, benzocyclobutene resins, polystyrenes, and a mixture thereof. In some embodiments, the dielectric layer can include a polyimide and/or a (meth)acrylate polymer. The dielectric layer can be a photosensitive layer or a non-photosensitive layer.

In some embodiments, the at least one binder is at least one fully imidized polyimide or its precursors.

In some embodiments, the at least one fully imidized polyimide polymer present in the dielectric layer has a glass transition temperature of at least about 180° C. (e.g., at least about 190° C., at least about 200° C., at least about 210° C., or at least about 220° C.) and/or at most about 300° C. (e.g., at most about 290° C., at most about 280° C., at most about 270° C., at most about 260° C., or at most about 250° C.).

Methods to synthesize fully imidized soluble polyimide polymers are well known to those skilled in the art. Examples of such methods are disclosed in, e.g., U.S. Pat. Nos. 3,856,752, 4,026,876, 4,629,777, 4,960,860, 5,122,436, 5,478,915, 5,969,055, 7,141,614, US2004/0235992, and U.S. Pat. No. 9,617,386, the contents of which are hereby incorporated by reference.

Imidization to form a polyimide can be confirmed by observation of characteristic absorptions in the infrared spectrum from 1770 and 1700 cm$^{-1}$ attributable to the imide ring structure.

In some embodiments, the at least one binder that can be used to prepare the dielectric layer can include at least one polybenzoxazole polymer or its precursors. Methods to synthesize polybenzoxazole polymer or its precursors are well known to those skilled in the art. Examples of such methods are disclosed in, e.g., U.S. Pat. Nos. 4,339,521, 4,395,482, 4,849,051, 5,104,733, 5,376,499, 5,688,631, 5,696,218, 5,750,638, 5,760,162, 5,777,066, 5,883,221, 6,177,225, 6,127,086, 6,235,436, 6,376,151, 6,939,659, 7,101,652, and 8,198,002, the contents of which are hereby incorporated by reference.

In some embodiments, the at least one binder that can be used to prepare the dielectric layer can include at least one (meth)acrylate polymer. Examples of suitable (meth)acrylate polymers include, but are not limited to, poly(benzyl methacrylate), poly(butyl methacrylate), poly(tert-butyl methacrylate), poly(butyl methacrylate-co-isobutyl methacrylate), poly(butyl methacrylate-co-methyl methacrylate), poly(cyclohexyl methacrylate), poly(2-ethylhexyl methacrylate), poly(ethyl methacrylate), poly(hexadecyl methacrylate), poly(hexyl methacrylate), poly(isobutyl methacrylate), poly(isopropyl methacrylate), poly(lauryl methacrylate-co-ethylene glycol dimethacrylate), poly(m-ethyl methacrylate), poly(methyl methacrylate-co-ethyl acrylate), poly(methyl methacrylate-co-ethylene glycol dimethacrylate), poly(octadecyl methacrylate), poly(tetrahydrofurfuryl methacrylate), poly(tetrahydrofurfuryl methacrylate-co-ethyl methacrylate), poly(butyl acrylate), poly(ethyl acrylate), poly(2-ethylhexyl acrylate), and poly(methyl acrylate).

In some embodiments, the at least one binder that can be used to prepare the dielectric layer can include at least one epoxy polymer. Examples of suitable epoxy polymers include, but are not limited to, bisphenol A epoxy polymers, bisphenol F epoxy polymers, novolac epoxy polymers, aliphatic epoxy polymers, and glycidylamine epoxy polymers.

In some embodiments, the at least one binder that can be used to prepare the dielectric layer can include a polymer containing at least one urethane moiety (e.g., one or more urethane repeat units), at least one amide moiety (e.g., one or more amide repeat units), at least one ester moiety (e.g., one or more ester repeat units), at least one ether moiety (e.g., one or more ether repeat units), at least one hydrocarbon moiety (e.g., one or more hydrocarbon repeat units), or a mixture thereof. Examples of polymers containing at least one ether moiety include, but are not limited to, polyethylene glycol (PEG), polypropylene glycol (PPG), poly(methyl vinyl ether), poly(methyl vinyl ether-alt-maleic anhydride) and polytetramethylene glycol (PTMG). Examples of polymers containing at least one hydrocarbon moiety include, but are not limited to, novolac and polystyrene.

In some embodiments, the dielectric layer is photosensitive. In some embodiments, the dielectric layer is non-photosensitive. In some embodiments, the dielectric layer is a photosensitive layer comprising at least one fully imidized polyimide polymer; at least one cross-linker and at least one initiator (e.g., a photoinitiator). Description of the cross-linker and initiator can be the same as provided earlier in this application with respect to the coupling layer. Such compositions are also disclosed in, e.g., patent applications no. US2014/0343199, US2015/0219990, US2016/0313641 and US2016/0313642, the contents of which are hereby incorporated by reference.

The dielectric layer composition of this disclosure can optionally include other components such as adhesion promoters, fillers, surfactants, plasticizers, colorants, and dyes.

Some embodiments of this disclosure include a process for preparing a multilayer structure described herein. The process can include: (a) coating a substrate with a composition that forms the coupling layer to form a first coated substrate; and (b) coating the first coated substrate with a composition that forms the dielectric layer.

In some embodiments, the process can further include cross-linking the coupling layer and/or the dielectric layer (e.g., by subjecting the first coated substrate to a step of baking or exposing to a source of light).

In some embodiments, the process can further patterning the dielectric layer (e.g., by a process selected from a the group consisting of a lithographic process, a laser ablation process, and a plasma etching process).

In some embodiments, the coupling layer and the dielectric layers can be formed by any suitable method including, but not limited to, spin coating, slit coating, spray coating, dip coating, knife or blade coating, dolt-die coating, lamination, dry film lamination and ink-jetting. One skilled in the art will know which coating method is appropriate for a given application.

In some embodiments, the baking steps can be done using contact or proximity heating on a hotplate at a fixed temperature or by ramping the temperature at a rate of 1-20° C./minute. In some embodiments, the baking steps can be done in an oven at a fixed temperature or by ramping the temperature at a rate of 1-20° C./minute either under vacuum or at atmospheric pressure. Irrespective of the baking method used, the baking steps can be performed in either a single step or multiple steps. Examples of suitable baking means include, but are not limited to, hotplates, infrared lamps, convection ovens, and thermal heating elements on ink jet printing heads. One skilled in the art will know which baking method is appropriate for a given application.

The thickness of the coupling layer is preferably at least about 50 nm (e.g., at least about 100 nm, at least about 200 nm, at least about 300 nm or at least about 400 nm) and/or at most about 1000 nm (e.g., at most about 900 nm, at most about 800 nm, at most about 700 nm or at most about 600 nm). The thickness of the dielectric layer of the multilayer structure of the present disclosure is not particularly limited. The thickness is preferably at least about 5 microns (e.g., at least about 10 microns, at least about 20 microns, at least about 35 microns, at least about 50 microns, or at least about 75 microns) and/or at most about 250 microns (e.g., at most about 200 microns, at most about 150 microns, at most about 125 microns, or at most about 100 microns).

In some embodiments, this disclosure features a multilayer structure containing (e.g., from bottom to top): a substrate; a coupling layer; and a dielectric layer such that the coupling layer is between the substrate and the dielectric layer and the coupling layer increases the shear strength with substrate by a factor of at least about 2 (e.g., by a factor of at least about 3), where the dielectric layer being a patterned, dielectric layer. The pattern on the dielectric layer can be formed by any of known techniques such as a lithographic process, a laser ablation process or a plasma etching process.

In some embodiments, the dielectric layer of the multilayer structure is capable of forming a patterned layer (e.g., containing a relief image) including at least one element having a feature size of at most about 250 microns (e.g., at most about 225 microns, at most about 200 microns, at most about 180 microns, at most about 160 microns, at most about 140 microns, at most about 120 microns, at most about 100 microns, at most about 80 microns, at most about 60 microns, at most about 40 microns, at most about 20 microns, at most about 15 microns, at most about 10 microns, at most about 8 microns, at most about 5 microns, at most about 4 microns, at most about 3 microns, or at most about 2 microns) and/or at least about 0.1 microns (e.g., at least about 0.5 microns or at least about 1 micron).

In some embodiments, when the dielectric layer is photosensitive, the dielectric layer can be patterned by a lithographic process. In such cases, the dielectric layer can be exposed to an actinic radiation. The exposure step can be completed by using light, or other actinic radiation (e.g., ultraviolet light, visible light, electron beam radiation, or X-rays). In some embodiments, i-line (365 nm), h-line (405 nm), or g-line (436 nm) UV light is utilized. In general, the exposure step can result in change in the dissolution rate of exposed areas. One skilled in the art will know which type of high energy radiation is appropriate for a given application.

In some embodiments, when the dielectric layer is formed from a negative tone photosensitive composition, after exposure of the dielectric layer, unexposed portions can be removed by using a developer to form a pattern. In some embodiments, developers include an organic solvent or a mixture of organic solvents. Suitable examples of developers include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol 2,5-dimethyl ether (2,5-dimethylisosorbide), 1,4:3,6-dianhydrosorbitol 2,5-diethyl ether (2,5-diethylisosorbide) and mixtures thereof. In some embodiments, the developers are gamma-butyrolactone (GBL), cyclopentanone (CP), cyclohexanone, 2,5-dimethyl ether (2,5-dimethylisosorbide), ethyl lactate (EL), n-butyl acetate (nBA) and dimethylsulfoxide (DMSO). In some embodiments, the developers are gamma-butyrolactone (GBL), cyclopentanone (CP) and cyclohexanone. These developers can be used individually or in combination of two or more to optimize the relief image quality for the particular composition and lithographic process.

In some embodiments, an aqueous developer can be used. Examples of aqueous developers include, but are not limited to, solutions of tetramethyl ammonium hydroxide (TMAH), potassium hydroxide, sodium hydroxide or sodium carbonate in water. In some embodiments, the aqueous developer contains additives such as a surfactant.

In some embodiments, the dielectric layer is patterned by irradiating with a laser beam. This process is called laser drilling or laser ablation. Direct laser ablation with a laser beam is a dry, one step material removal. In some embodiments, the wavelength of the laser is 355 nm or less (e.g., 308 nm or less). Examples of suitable laser ablation methods include, but are not limited to, the methods described in U.S. Pat. Nos. 7,598,167, 6,667,551, and 6,114,240, which are hereby incorporated by reference.

In some embodiments, the dielectric layer can be patterned by plasma etching. Examples of gasses used in the plasma etching includes, but not limited to, trifluoromethane ($CHF_3$), tetrafluoromethane ($CF_4$), octafluorocyclobutane ($C_4F_8$), chlorine ($Cl_2$), boron trichloride ($BCl_3$) and sulfur hexafluoride ($SF_6$).

The present disclosure is illustrated in more detail with reference to the following examples, which are for illustrative purposes and should not be construed as limiting the scope of the present disclosure.

EXAMPLES

Synthesis Example 1 (P-1)

Preparation of 6FDA/DAPI Polyimide

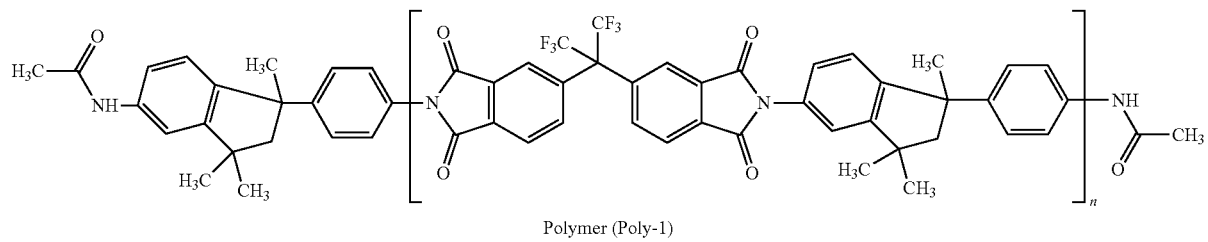

Polymer (Poly-1)

Solid 4,4'-(hexafluoroisopropylidene)diphthalic anhydride (6FDA) (334.0 g) was charged to a solution of 5(6)-amino-1-(4-aminophenyl)-1,3,3-trimethylindane (DAPI) (218.4 g) in NMP (2206 g) at room temperature. Additional NMP (816 g) was used to rinse the dianhydride into solution. The reaction temperature was increased to 60° C. and the mixture was allowed to react for 3.5 hours. Next, acetic anhydride (125.7 g) and pyridine (49.5 g) were added, the reaction temperature was increased to 100° C., and the mixture was allowed to react for 12 hours. The reaction mixture was cooled to room temperature and diluted with an equal volume of THF. The diluted solution was slowly added to water (10×) to precipitate the crude polymer. The crude polymer was isolated by vacuum filtration and washed with water. The crude wet polymer was slurried with methanol, collected by vacuum filtration and dried under vacuum at 45° C. overnight.

Formulation Example 1 (FE-1)

A photosensitive composition FE-1 was prepared by using 367.81 g of polymer (P-1), 1147.13 g of cyclopentanone, 22.07 g of a 0.5 wt % solution of PolyFox 6320 (available from OMNOVA Solutions) in cyclopentanone, 18.39 g of methacryloxypropyl trimethoxysilane, 11.03 g of NCI-831 (trade name, available from ADEKA corporation), 0.77 g para-benzoquinone, 124.14 g of tetra-ethyleneglycol diacrylate, and 41.38 g pentaerythritol triacrylate. After being stirred mechanically for 24 hours, the solution was filtered by using a 0.2 micron filter.

Dry Film Example DF-1

Photosensitive solution (FE-1) was applied using reverse microbar coater from Fujifilm USA (Greenwood, S.C.) with line speed of 5 feet/minutes (150 cm per minutes) with 60 microns microbar clearance onto a polyethylene terephthalate (PET) film (TA 30, manufactured by Toray Plastics America, Inc.) having a width of 16.2" and thickness of 35 microns used as a carrier substrate and dried at 194° F. to obtain a photosensitive polymeric layer with a thickness of approximately 15.0 microns (DF-1). On this polymeric layer, a biaxially oriented polypropylene film having width of 16" and thickness of 30 microns (BOPP, manufactured by Impex Global, Houston, Tex.) was laid over by a roll compression to act as a protective layer.

Coupling Layer Composition Example 1 (CLC-1)

Coupling layer composition (CLC-1) was prepared by mixing of 13.35 g of a 35% solution of poly(N,N-dimethylamino ethyl acrylate) in PGMEA, 80.07 g of PGMEA, 0.95 g of tetra-ethyleneglycol diacrylate, 0.47 g of CN992 (an urethane Acrylate available from Sartomer) and 0.18 g of NCI-831.

Example 1

A 4 inch wafer of epoxy mold compound (EMC) was spin coated with the CLC-1 at a thickness of 0.15 micron (150 nm) to form a coupling layer on EMC. Protective layer of DF-1 was removed and the photosensitive film was laminated on the CLC-1 coated EMC wafer at a temperature of 100° C. under 40 psi of pressure using Optek Laminator Model DPL-24A. After removing the PET film (carrier layer) the photosensitive film was exposed to a source of broad-band light (g, h or i-line) at a dose of 250 mJ/cm$^2$ using a shear test mask containing groups of 200 micron× 200 micron posts. The film was then developed by using cyclopentanone (2×140 seconds) and rinsed with PGMEA. The post patterns thus formed were baked at 170° C. for two hours in an oven. The shear test on the posts was performed using a XYZTEC Condor Sigma shear tester. The shear test included measurement of shear strength of two groups of 15 posts. Shear strength was measured as the force (in gram) required to detach a post (including both a coupling layer and a dielectric layer) from the substrate.

The measured shear strength of the coupling and dielectric layers for the multilayer structure of Example 1 was 60 gram force.

Comparative Example 1

Protective layer of DF-1 was removed and the photosensitive film was laminated on a 4 inch wafer of epoxy mold compound (EMC) at a temperature of 100° C. under 40 psi of pressure using Optek Laminator Model DPL-24A in the absence of a coupling layer. After removing the PET film (carrier layer), the photosensitive film was exposed to aa source of broad-band light (g, h and i-line) at a dose of 250 mJ/cm$^2$ using a shear test mask containing groups of 200 micron×200 micron posts. The film was then developed by using cyclopentanone (2×140 seconds) and rinsed with PGMEA. The post patterns thus formed were baked at 170° C. for two hours in an oven. The shear test on the posts was performed using a XYZTEC Condor Sigma shear tester as describe in Example 1. Shear strength was measured as the force (in gram) required to detach a post (including a dielectric layer but not a coupling layer) from the substrate. The measured shear strength was 20 gram force. Comparison of Example 1 and Comparative Example 1 showed surprisingly that the presence of coupling layer CLC-1 in Example 1 improved the shear strength by a factor of 3.

What is claimed is:

1. A multilayer structure, comprising:
    a substrate;
    a coupling layer deposited on the substrate, the coupling layer comprising at least one (meth)acrylate polymer, at least one cross-linker, and at least one initiator capable of inducing a cross-linking reaction; and
    a dielectric layer deposited on the coupling layer, the dielectric layer comprising at least one fully imidized polyimide polymer, at least one cross-linker, and at least one initiator capable of inducing a cross-linking reaction;
    wherein shear strength of the dielectric layer is increased by a factor of at least about 2 in the presence of the coupling layer compared to a multilayer structure without the coupling layer.

2. The multilayer structure of claim 1, wherein the coupling layer increases the shear strength of the dielectric layer by a factor of at least about 3.

3. The multilayer structure of claim 1, wherein the substrate comprises an epoxy molded compound.

4. The multilayer structure of claim 3, wherein the substrate comprises embedded semiconductor devices.

5. The multilayer structure of claim 3, wherein the multilayer structure further comprises at least one patterned metallic structure at a surface of the substrate.

6. The multilayer structure of claim 1, wherein the cross-linker in the coupling layer comprises at least one functional group selected from the group consisting of a vinyl group, an allyl group, a vinyl ether group, a propenyl ether group, a (meth)acryloyl group, a SiH group, and a thiol group.

7. The multilayer structure of claim 1, wherein the dielectric layer contains at least one additional polymer selected from a group consisting of polyimides, polybenzoxazoles, (meth)acrylate polymers, epoxy polymers, polyurethanes, polyamides, polyesters, polyethers, novolac resins, benzocyclobutene resins, polystyrenes, and a mixture thereof.

8. The multilayer structure of claim 7, wherein the dielectric layer is a photosensitive layer.

9. A process for preparing the multilayer structures claim 1, comprising:
    (a) coating a substrate with a composition that forms the coupling layer to form a first coated substrate; and
    (b) coating the first coated substrate with a composition that forms the dielectric layer.

10. The process of claim 9, further comprising cross-linking the coupling layer by subjecting the first coated substrate to a step of baking or exposing to a source of light.

11. The process of claim 9, where further comprising cross-linking the dielectric layer by subjecting the dielectric layer to a step of baking or exposing to a source of light.

12. The process of claim 9, further comprising patterning the dielectric layer by a process selected from the group consisting of a lithographic process, a laser ablation process, and a plasma etching process.

13. A three dimensional object, comprising at least one multilayer structure formed by the process claim 12.

14. A semiconductor device, comprising the three dimensional object of claim 13.

15. A multilayer structure, comprising:
    a substrate;
    a cross-linked coupling layer deposited on the substrate, the coupling layer comprising at least one (meth) acrylate polymer; and
    a cross-linked dielectric layer deposited on the coupling layer, the dielectric layer comprising at least one fully imidized polyimide polymer;

wherein shear strength of the dielectric layer is increased by a factor of at least about 2 in the presence of the coupling layer compared to a multilayer structure without the coupling layer.

16. The multilayer structure of claim 1, wherein the at least one (meth)acrylate polymer is the only polymer in the coupling layer.

* * * * *

UNITED STATES PATENT AND TRADEMARK OFFICE
CERTIFICATE OF CORRECTION

PATENT NO. : 11,634,529 B2
APPLICATION NO. : 16/009256
DATED : April 25, 2023
INVENTOR(S) : Sanjay Malik and William A. Reinerth It is certified that error appears in the above-identified patent and that said Letters Patent is hereby corrected as shown below:

In the Claims

Column 12
Line 40, in Claim 9, delete "structures" and insert -- structure of --.
Line 49, in Claim 11, before "further" delete "where".
Line 57, in Claim 13, delete "the process claim 12." and insert -- the process of claim 9. --.

Signed and Sealed this
Thirteenth Day of June, 2023

Katherine Kelly Vidal
*Director of the United States Patent and Trademark Office*